(12) United States Patent
Kawakubo

(10) Patent No.: US 6,809,565 B2
(45) Date of Patent: Oct. 26, 2004

(54) SEMICONDUCTOR DEVICE

(75) Inventor: Tomohiro Kawakubo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/393,995

(22) Filed: Mar. 24, 2003

(65) Prior Publication Data
US 2004/0041602 A1 Mar. 4, 2004

(30) Foreign Application Priority Data
Aug. 28, 2002 (JP) ........................................ 2002-249437

(51) Int. Cl.$^7$ .............................................. H03L 7/00
(52) U.S. Cl. ................................................... 327/143
(58) Field of Search ................................ 327/142, 143, 327/198

(56) References Cited

U.S. PATENT DOCUMENTS 5,027,006 A * 6/1991 Queinnec et al. ........... 327/143
5,172,012 A * 12/1992 Ueda ........................... 327/143
5,825,220 A * 10/1998 Kinugasa et al. ............ 327/143
6,104,221 A * 8/2000 Hoon ........................... 327/143
6,636,089 B2 * 10/2003 Majcherczak et al. ...... 327/143

FOREIGN PATENT DOCUMENTS

JP      2002-124861      4/2002

* cited by examiner

Primary Examiner—Jeffrey Zweizig
(74) Attorney, Agent, or Firm—Arent Fox, PLLC

(57) ABSTRACT

A semiconductor device that has the function of initializing an intern circuit. A starter sign generation circuit outputs a starter sign for initializing the intern circuit in the semiconductor device on the basis of input power supply voltage. A latch circuit holds and outputs the starter sign. A shutoff circuit shuts off input of the power supply voltage to the starter sign generation circuit when the starter sign is output. That is to say, the starter sign output on the basis of the power supply voltage is held by the latch circuit and the power supply voltage input to the starter sign generation circuit is shut off. As a result, consumption of power is reduced.

7 Claims, 7 Drawing Sheets

SEMICONDUCTOR DEVICE

CROSS-REFERENCE TO RELATED APPLICATIONS

This application is based upon and claims priority of, Japanese Patent Application No. 2002-249437, filed on Aug. 28, 2002, in Japan, the contents being incorporated herein by reference.

BACKGROUND OF THE INVENTION (1) Field of the Invention

This invention relates to a semiconductor device and, more particularly, to a semiconductor device which outputs a starter sign to initialize an intern circuit.

(2) Description of the Related Art

An intern circuit in a semiconductor device must be initialized at start time to avoid the indefinite state of the intern circuit after the semiconductor device being started. A semiconductor device outputs a starter sign at start time by an intern starter circuit to reset its intern circuit (see Japanese Patent Laid-Open Publication No. 2002-124861, p. 2, FIG. 9, for example).

FIG. 7 is a view showing a starter circuit in a convention semiconductor device. The starter circuit shown in FIG. 7 is formed in a semiconductor device and initializes an intern circuit by a starter sign. The starter circuit includes transistors Q9 through Q11, inverter circuits Z11 and Z12, and resistors R5 through R7.

The resistors R5 and R6 are connected in series between power supply VDD and the ground of the power supply VDD.

The transistor Q9 is an n-channel MOS transistor. A gate of the transistor Q9 is connected to a point where the resistors R5 and R6 connect. A source of the transistor Q9 is connected to the ground of the power supply VDD. A drain of the transistor Q9 is connected to the power supply VDD via the resistor R7.

The transistor Q10 is a p-channel MOS transistor. The transistor Q11 is an n-channel MOS transistor. Gates of the transistors Q10 and Q11 are connected to each other and are connected to the drain of the transistor Q9. A source of the transistor Q10 is connected to the power supply VDD. A drain of the transistor Q10 is connected to a drain of the transistor Q11. A source of the transistor Q11 is connected to the ground of the power supply VDD.

The inverter circuit Z11 is connected to the drains of the transistors Q10 and Q11. The input side of the inverter circuit Z12 is connected to the output side of the inverter circuit Z11. Each of the inverter circuits Z11 and Z12 inverts and outputs an input sign.

Now, the operation of the starter circuit will be described.

When power is applied to the semiconductor device, the voltage of the power supply VDD rises and voltage at the point where the resistors R5 and R6 connect rises. The source-drain area of the transistor Q9 is in the off state before voltage at the point where the resistors R5 and R6 connect rises to the threshold voltage of the transistor Q9. Therefore, the voltage ("H" state) of the power supply VDD is input to the gates of the transistors Q10 and Q11 and only the source-drain area of the transistor Q11 goes into the on state. The voltage ("L" state) of the ground of the power supply VDD is input to the inverter circuit Z11 via the transistor Q11. The inverter circuit Z11 inverts a sign in the "L" state and outputs a sign in the "H" state. The inverter circuit Z12 outputs a starter sign sttx in the "L" state.

When voltage at the point where the resistors R5 and R6 connect rises to the threshold voltage of the transistor Q9 (when the voltage of the power supply VDD rises to voltage at which the intern circuit can perform norm operation), the source-drain area of the transistor Q9 goes into the on state. Therefore, the voltage ("L" state) of the ground of the power supply VDD is input to the gates of the transistors Q10 and Q11 and only the source-drain area of the transistor Q10 goes into the on state. The voltage ("H" state) of the power supply VDD is input to the inverter circuit Z11 via the transistor Q10. The inverter circuit Z11 inverts a sign in the "H" state and outputs a sign in the "L" state. The inverter circuit Z12 outputs the starter sign sttx in the "H" state. Initialization of the intern circuit in the semiconductor device terminates when the starter sign sttx rises from the "L" state to the "H" state.

As stated above, when the voltage of the power supply VDD rises to predetermined voltage, the starter sign sttx output from the starter circuit shown in FIG. 7 rises from the "L" state to the "H" state. The intern circuit in the semiconductor device is initialized and then performs norm operation.

By the way, with semiconductor devices the power consumption of which is low, an electric current must be decreased by sever microamperes.

With the convention semiconductor device, however, the voltage of the power supply VDD is supplied to the starter circuit even at norm operation time after initialization of the intern circuit and an electric current flows through the resistors R5 to R7. As a result, power is consumed.

SUMMARY OF THE INVENTION

The present invention was made under the background circumstances as described above. An object of the present invention is to provide a semiconductor device which shuts off at norm operation time power supply voltage input to a starter circuit to reduce power consumption.

In order to achieve the above object, a semiconductor device which initializes an intern circuit is provided. This semiconductor device includes a starter sign generation circuit for outputting a starter sign which initializes an intern circuit on the basis of input power supply voltage, a latch circuit for holding and outputting the starter sign, and a shutoff circuit for shutting off the power supply voltage input to the starter sign generation circuit at the time of the starter sign being output.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
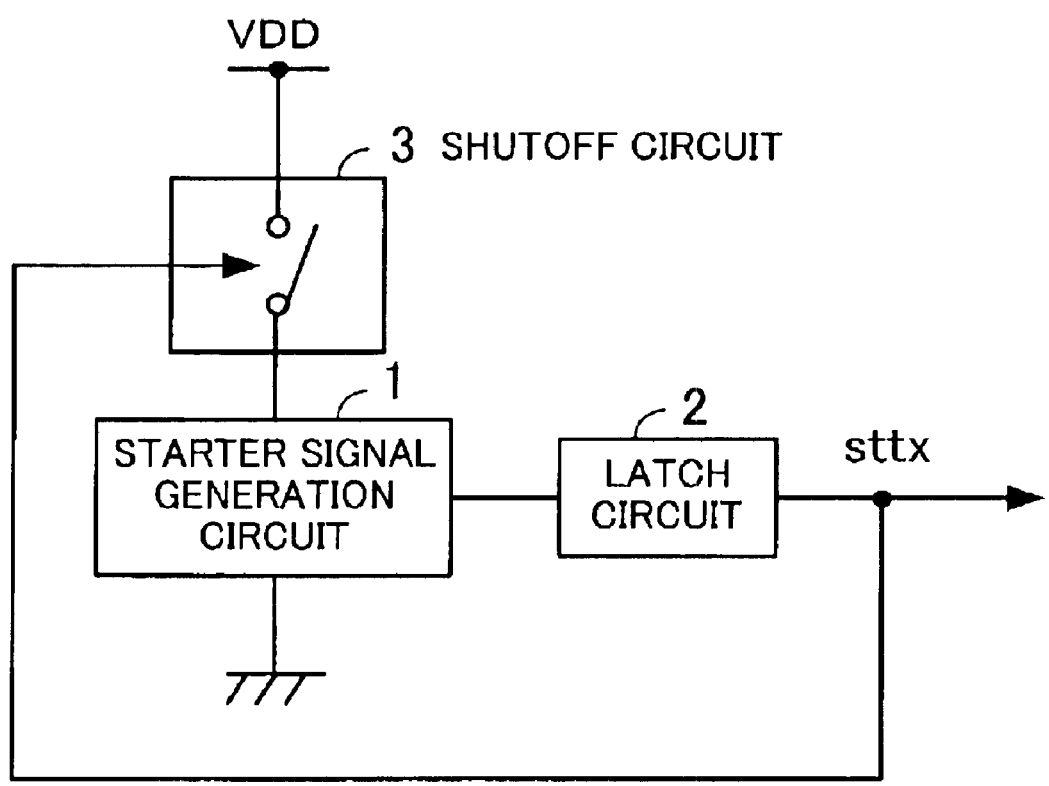
FIG. 1 is a view for describing the principles underlying the present invention.

FIG. 1 is a view for describing the principles underlying the present invention. As shown in FIG. 1, a semiconductor device includes a starter sign generation circuit 1, a latch circuit 2, and a shutoff circuit 3.

The voltage of power supply VDD is input to the starter sign generation circuit 1. The starter sign generation circuit 1 outputs a starter sign sttx for initializing an intern circuit in the semiconductor device on the basis of the voltage of the power supply VDD. For example, when power is applied to the power supply VDD, the voltage of the power supply VDD rises. The starter sign generation circuit 1 outputs a starter sign sttx when the voltage of the power supply VDD rises to voltage at which the intern circuit in the semiconductor device can perform norm operation.

The latch circuit 2 holds and outputs a starter sign sttx output from the starter sign generation circuit 1.

When a starter sign sttx is output from the starter sign generation circuit 1 (when a starter sign sttx output from the starter sign generation circuit 1 is held by the latch circuit 2), the shutoff circuit 3 shuts off the voltage of the power supply VDD input to the starter sign generation circuit 1.

Now, operation performed in FIG. 1 will be described.

It is assumed that power is applied to the power supply VDD and that the voltage of the power supply VDD rises. When the voltage of the power supply VDD input to the starter sign generation circuit 1 rises to voltage at which the intern circuit in the semiconductor device can perform norm operation, the starter sign generation circuit 1 outputs a starter sign sttx.

The latch circuit 2 holds and outputs the starter sign sttx output from the starter sign generation circuit 1.

When the starter sign sttx is output from the latch circuit 2, the shutoff circuit 3 shuts off the voltage of the power supply VDD input to the starter sign generation circuit 1. Even if input of the voltage of the power supply VDD to the starter sign generation circuit 1 is shut off by the shutoff circuit 3, the starter sign sttx will not become unstable because it is held by the latch circuit 2.

As stated above, when the voltage of the power supply VDD rises to voltage at which the intern circuit can perform norm operation, the starter sign generation circuit 1 outputs a starter sign sttx and the latch circuit 2 holds and outputs it. The shutoff circuit 3 then shuts off the voltage of the power supply VDD input to the starter sign generation circuit 1. This reduces the power consumption of the semiconductor device.

A first embodiment of the present invention will now be described.

Figure 2:
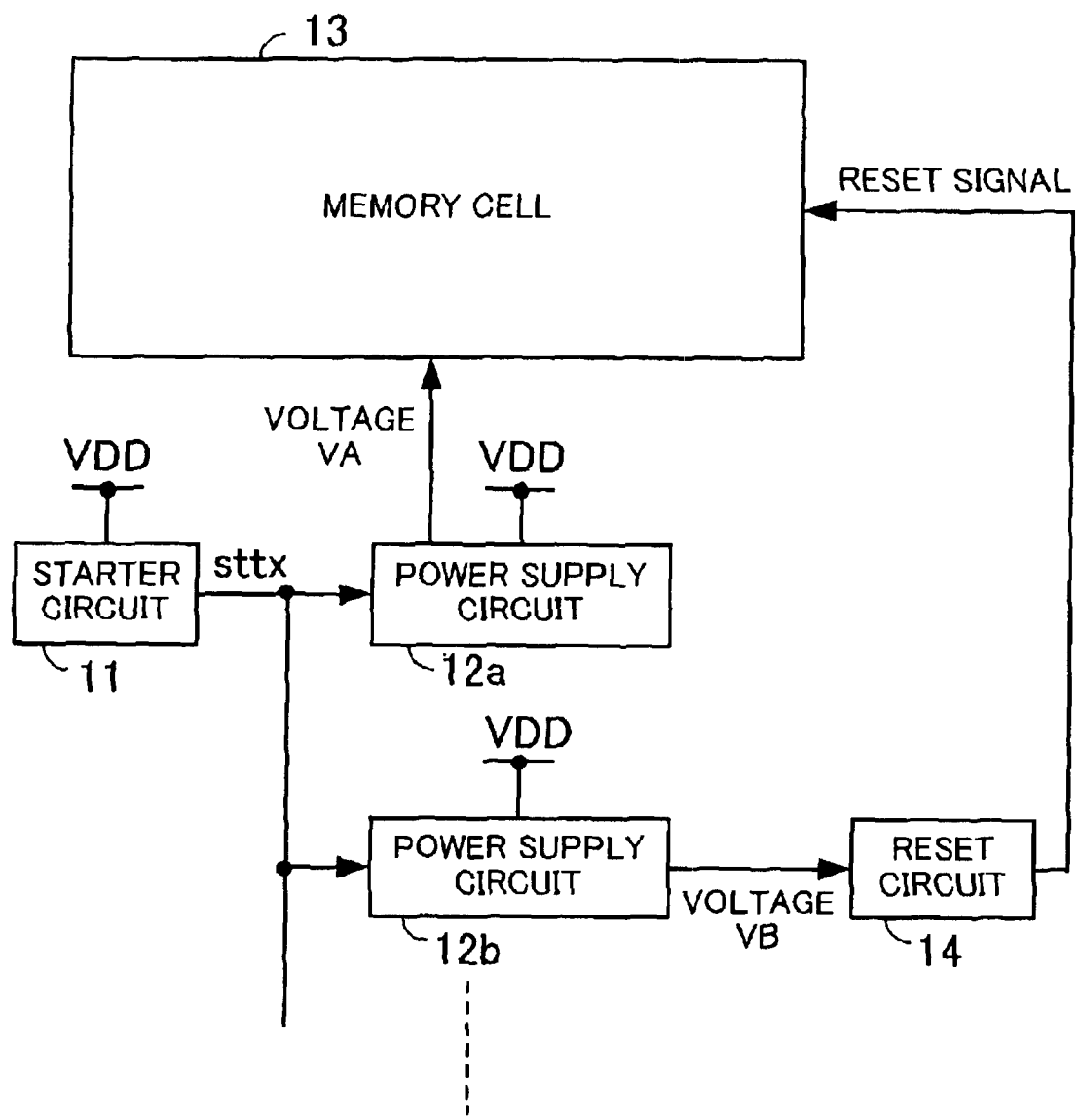
FIG. 2 is a block diagram of a semiconductor device according to a first embodiment of the present invention.

FIG. 2 is a block diagram of a semiconductor device according to a first embodiment of the present invention. As shown in FIG. 2, a semiconductor device comprises a starter circuit 11, power supply circuits 12a, 12b, . . . , a memory cell 13, and a reset circuit 14.

The voltage of the power supply VDD supplied to the semiconductor device is input to the starter circuit 11. When the voltage of the power supply VDD rises to voltage at which the power supply circuits 12a, 12b, . . . can perform normal operation, the starter circuit 11 outputs a starter sign sttx for initializing the power supply circuits 12a, 12b, . . . . That is to say, the starter circuit 11 initializes the indefinite state of the power supply circuits 12a, 12b, . . . at the time of power being applied to the power supply VDD.

The power supply circuit 12a is initialized by a starter sign sttx output from the starter circuit 11. The voltage of the power supply VDD is input to the power supply circuit 12a. The power supply circuit 12a generates an intern voltage VA and outputs it to the memory cell 13.

The power supply circuit 12b is initialized by a starter sign sttx output from the starter circuit 11. The voltage of the power supply VDD is input to the power supply circuit 12b. The power supply circuit 12b generates an intern voltage VB and outputs it to the reset circuit 14.

The reset circuit 14 operates by the voltage VB supplied from the power supply circuit 12b. The reset circuit 14 outputs a reset sign for resetting the memory cell 13.

Figure 3:
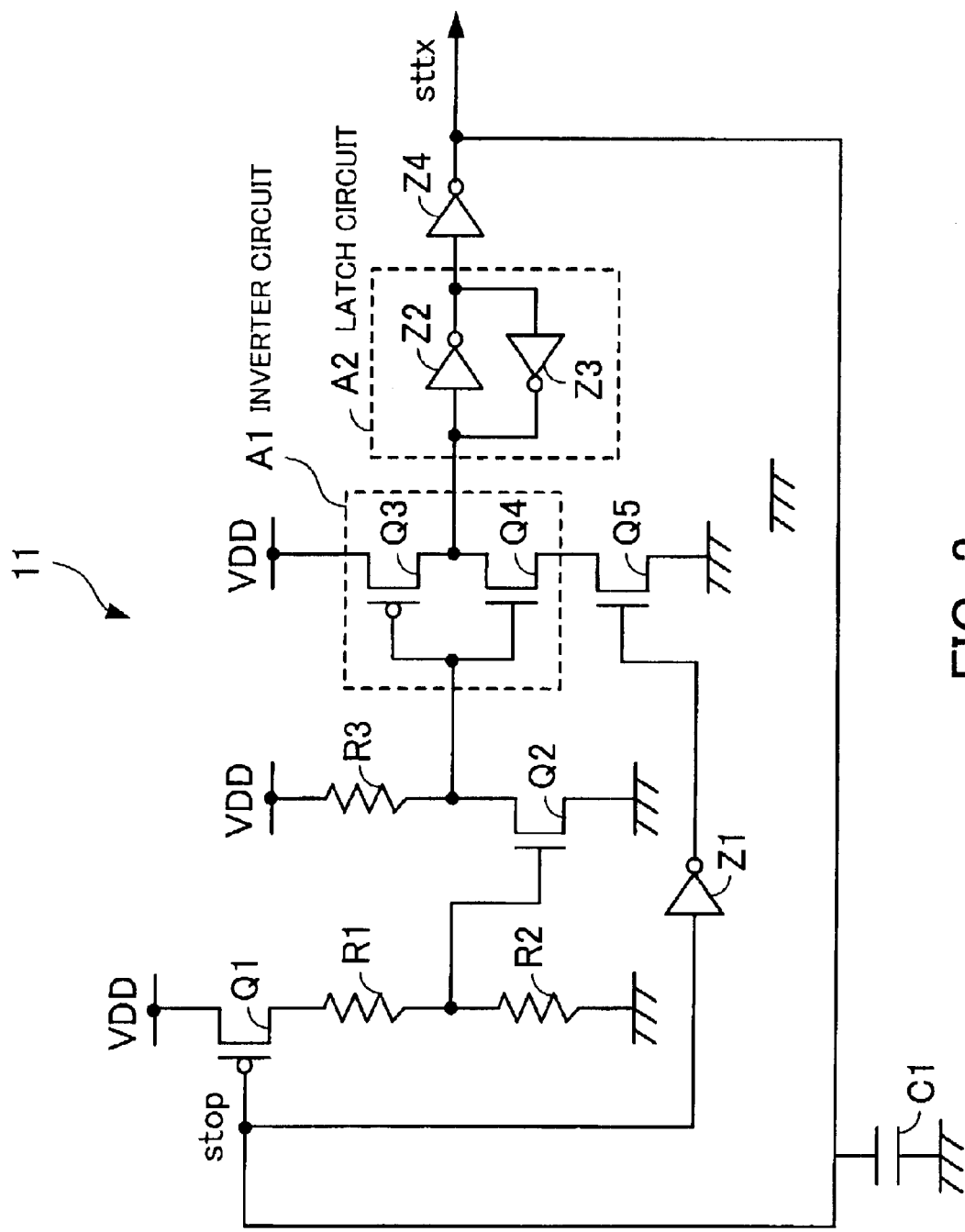
FIG. 3 is a view showing a starter circuit in the semiconductor device shown in FIG. 2.

FIG. 3 is a view showing the starter circuit in the semiconductor device shown in FIG. 2. The starter circuit 11 shown in FIG. 3 includes transistors Q1 through Q5, inverter circuits Z1 through Z4, resistors R1 through R3, and a capacitor C1. When the voltage of the power supply VDD rises to voltage at which the power supply circuits 12a, 12b, . . . can perform norm operation, the starter circuit 11 outputs a starter sign sttx for initializing the power supply circuits 12a, 12b, . . . .

The transistor Q1 is a p-channel MOS transistor. A source and drain of the transistor Q1 are connected to the power supply VDD and resistor R1 respectively. A gate of the transistor Q1 is connected to the output side of the inverter circuit Z4.

The resistors R1 and R2 are connected in series. One end of the resistor R1 is connected to the drain of the transistor Q1. One end of the resistor R2 is connected to the ground of the power supply VDD.

The transistor Q2 is an n-channel MOS transistor. A gate of the transistor Q2 is connected to a point where the resistors R1 and R2 connect. A source of the transistor Q2 is connected to the ground of the power supply VDD. A drain of the transistor Q2 is connected to one end of the resistor R3. The other end of the resistor R3 is connected to the power supply VDD.

The transistor Q3 is a p-channel MOS transistor. The transistor Q4 is an n-channel MOS transistor. Gates of the transistors Q3 and Q4 are connected to each other and are connected to the drain of the transistor Q2. A source of the transistor Q3 is connected to the power supply VDD. A drain of the transistor Q3 is connected to a drain of the transistor Q4. A source of the transistor Q4 is connected to a drain of the transistor Q5. The transistors Q3 and Q4 make up an inverter circuit A1.

The transistor Q5 is an n-channel MOS transistor. A gate of the transistor Q5 is connected to the output side of the inverter circuit Z1. A source of the transistor Q5 is connected to the ground of the power supply VDD. The input side of the inverter circuit Z1 is connected to the gate of the transistor Q1.

The input side of the inverter circuit Z2 is connected to the drains of the transistors Q3 and Q4. The output side of the inverter circuit Z2 is connected to the input side of the inverter circuit Z4. The input side of the inverter circuit Z3 is connected to the output side of the inverter circuit Z2. The output side of the inverter circuit Z3 is connected to the input side of the inverter circuit Z2. The inverter circuits Z2 and Z3 make up a latch circuit A2.

The capacitor C1 is connected between a wiring which connects the gate of the transistor Q1 and the output side of the inverter circuit Z4 and the ground of the power supply VDD so that the voltage of the gate of the transistor Q1 and the output side of the inverter circuit Z4 will be the same as the voltage ("L" state) of the ground of the power supply VDD at the time of power being applied to the power supply VDD. One of the following two methods may be used instead of connecting the capacitor C1. One method is to connect a clamping circuit for putting the gate of the transistor Q1 and the output side of the inverter circuit Z4 into the "L" state. The other method is to disconnect the gate of the transistor Q1 from the output side of the inverter circuit Z4 and to input an external sign in the "L" state input to the semiconductor device at the time of power being applied to the power supply VDD to the gate of the transistor Q1.

Now, the operation of the starter circuit 11 shown in FIG. 3 will be described.

It is assumed that power is applied to the power supply VDD. At this time a starter sign sttx output from the inverter circuit Z4 is in the "L" state. A stop sign stop in the "L" state is input to the gates of the transistor Q1. A stop sign stop in the "H" state is input to the gate of the transistor Q5 via the inverter circuit Z1. As a result, the source-drain area of the transistor Q1 goes into the on state and the voltage of the power supply VDD is divided by the resistors R1 and R2 connected in series. Voltage at the point where the resistors R1 and R2 connect is input to the gate of the transistor Q2.

The values of the resistors R1 and R2 are set so that voltage at the point where the resistors R1 and R2 connect will reach the threshold voltage of the transistor Q2 at the time of the voltage of the power supply VDD rising to voltage at which the power supply circuits 12a, 12b, . . . can perform norm operation.

When the voltage of the power supply VDD rises and voltage at the point where the resistors R1 and R2 connect reaches the threshold voltage of the transistor Q2, the source-drain area of the transistor Q2 goes into the on state. As a result, the voltage of the drain of the transistor Q2 becomes equal to that of the ground of the power supply VDD. Therefore, the voltage of the ground of the power supply VDD, that is to say, a sign in the "L" state will be input to the inverter circuit.

The stop sign stop in the "H" state was input to the transistor Q5 via the inverter circuit Z1, so the source-drain area of the transistor Q5 is in the on state and the inverter circuit is in an operating state. The inverter circuit therefore inverts the input sign in the "L" state and outputs a generated sign in the "H" state.

The latch circuit 2 inverts the sign in the "H" state output from the inverter circuit A1, holds the "L" state of a generated sign, and outputs it to the inverter circuit Z4.

The inverter circuit Z4 inverts the sign in the "L" state output from the latch circuit A2 and outputs a starter sign sttx in the "H" state. Moreover, the inverter circuit Z4 outputs the sign obtained by inverting the sign in the "L" state output from the latch circuit A2 to the transistors Q1 and Q5 as the stop sign stop in the "H" state.

The transition of the starter sign sttx from the "L" state to the "H" state initializes the power supply circuits 12a, 12b, . . . .

The stop sign stop in the "H" state puts the source-drain area of the transistor Q1 into the off state. Therefore, an electric current does not flow from the power supply VDD, through the resistors R1 and R2, to the ground. The stop sign stop in the "H" state so puts the source-drain area of the transistor Q5 into the off state and stops the operation of the inverter circuit A1. Output from the inverter circuit goes into a floating state, but the starter sign sttx in the "H" state is held by the latch circuit A2.

As stated above, when the voltage of the power supply VDD rises to voltage at which the power supply circuits 12a, 12b, . . . can perform norm operation, the starter circuit 11 holds and outputs a starter sign sttx and shuts off the input voltage of the power supply VDD by the transistors Q1 and Q5. As a result, the amount of an electric current consumed by the semiconductor device can be reduced.

Circuits initialized by a starter sign sttx are not limited to the power supply circuits 12a, 12b, . . . . Other intern circuits included in the semiconductor device may be initialized.

Figure 4:
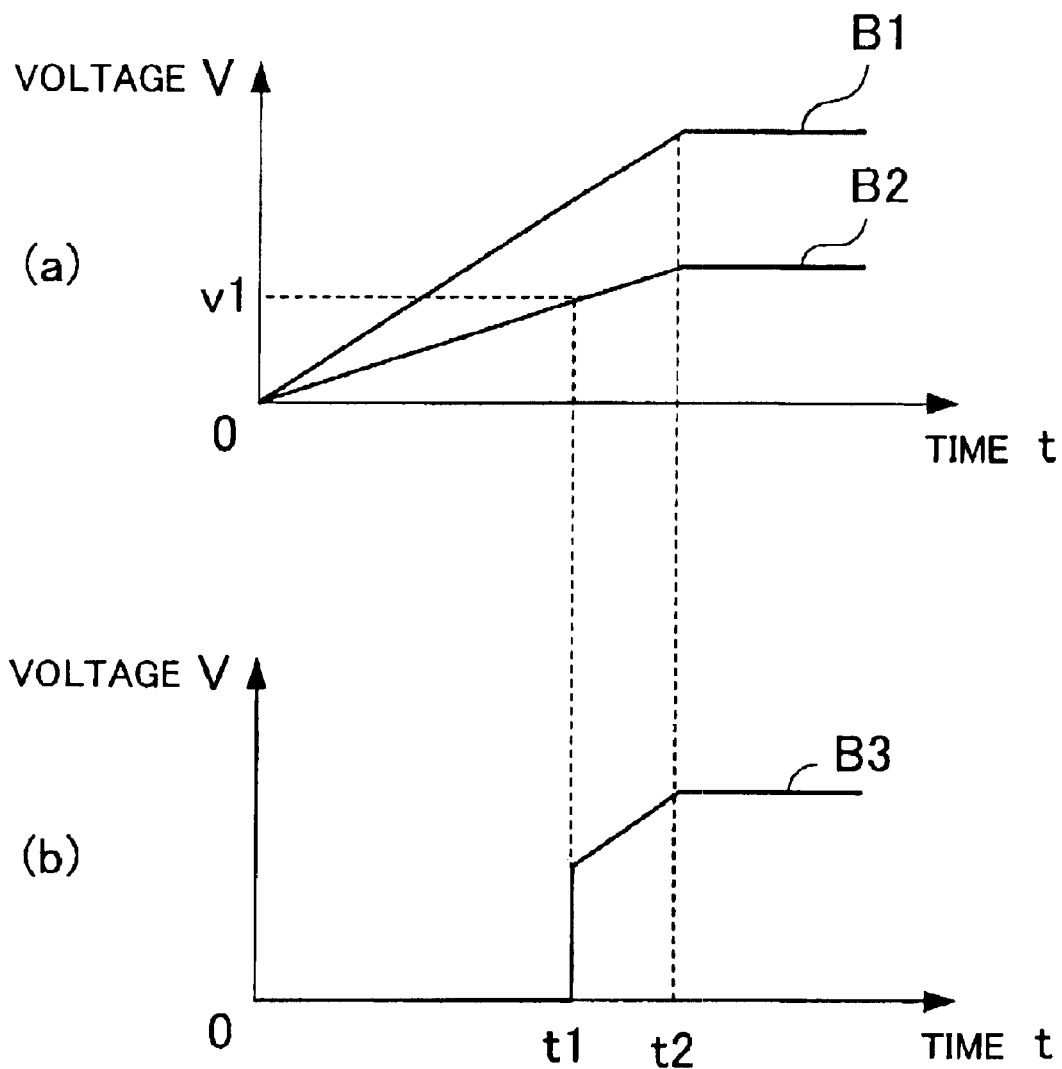
FIG. 4 is a view showing the relations among power supply voltage, divided voltage, and a starter sign, FIG. 4(a) being a view showing the power supply voltage and the divided voltage, FIG. 4(b) being a view showing the starter sign.

FIG. 4 is a view showing the relations among power supply voltage, divided voltage, and a starter sign. FIG. 4(a) is a view showing the power supply voltage and the divided voltage. FIG. 4(b) is a view showing the starter sign. Waveforms B1 and B2 shown in FIG. 4(a) indicate the waveform of the voltage of the power supply VDD and voltage at the point where the resistors R1 and R2 connect, respectively. Waveform B3 shown in FIG. 4(b) indicates a starter sign sttx output from the inverter circuit Z4. Waveform B2 indicative of voltage at the point where the resistors R1 and R2 connect is obtained in a case where the resistance values of the resistors R1 and R2 are the same.

When power is applied to the power supply VDD, the voltage of the power supply VDD rises as shown by waveform B1. The resistance values of the resistors R1 and R2 are the same. Accordingly, as shown by waveform B2, voltage at the point where the resistors R1 and R2 connect is half of that of the power supply VDD and gradually rises. It is assumed that the threshold voltage of the transistor Q2 is v1. As shown by waveform B3, the starter sign sttx changes from the "L" state to the "H" state at time t1. The voltage of the starter sign sttx rises from time t1 to time t2 according to the voltage of the power supply VDD which is still rising.

As stated above, the starter sign sttx is output time t1 after power being applied to the power supply VDD, that is to say, when the voltage of the power supply VDD rises to voltage at which an intern circuit in the semiconductor device can perform norm operation.

Now, a second embodiment of the present invention will be described.

Figure 5:
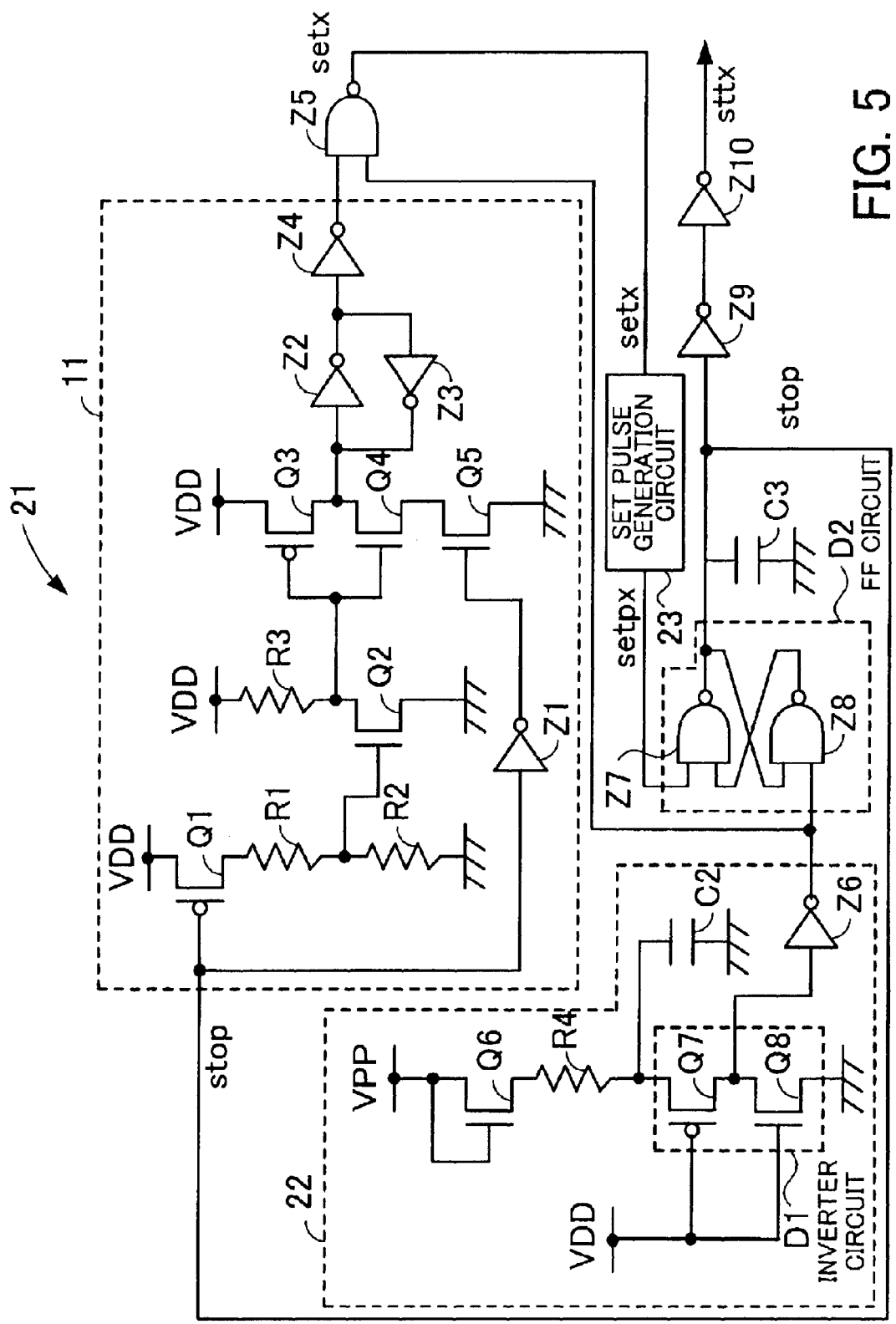
FIG. 5 is a view showing a starter circuit in a semiconductor device according to a second embodiment of the present invention.

FIG. 5 is a view showing a starter circuit in a semiconductor device according to a second embodiment of the present invention. With the starter circuit according to the first embodiment of the present invention shown in FIG. 3, if a short break has occurred in the voltage of the power supply VDD applied, the short break cannot be detected and an intern circuit cannot be initialized. The reason for this is that the voltage of the power supply VDD is shut off by the transistor Q1. The starter circuit in a semiconductor device according to the second embodiment includes a detection circuit for detecting a short break in the case of the short break having occurred in the voltage of power supply applied and for releasing a shutoff of the voltage of the power supply. Components in the starter circuit shown in FIG. 5 which are the same as those in the starter circuit 11 shown in FIG. 3 are marked with the same symbols and descriptions of them will be omitted.

A starter circuit 21 shown in FIG. 5 includes a detection circuit 22 comprising transistors Q6 through Q8, an inverter circuit Z6, a capacitor C2, and a resistor R4. Furthermore, the starter circuit 21 includes the starter circuit 11 shown in FIG. 3, NAND circuits Z5, Z7 and Z8, a capacitor C3, inverter circuits Z9 and Z10, and a set pulse generation circuit 23.

The detection circuit 22 will be described first.

The detection circuit 22 detects a short break (drop) in the voltage of the power supply VDD and outputs a sign for releasing a shutoff of input of the voltage of the power supply VDD by the transistors Q1 and Q5 in the starter circuit 11.

The transistor Q6 is an n-channel MOS transistor. A gate and drain of the transistor Q6 are connected. That is to say, diode connection is performed on the transistor Q6. The gate and drain of the transistor Q6 are connected to power supply VPP. A source of the transistor Q6 is connected to the resistor R4. The power supply VPP is a voltage source which increases and outputs the voltage of the power supply VDD. The voltage of the power supply VPP is higher than that of the power supply VDD. When a short break occurs in the voltage of the power supply VDD, the voltage of the power supply VPP will drop more slowly than that of the power supply VDD due to capacitance in the semiconductor device.

The transistor Q7 is a p-channel MOS transistor. A gate of the transistor Q7 is connected to the power supply VDD. A source of the transistor Q7 is connected to the resistor R4. A drain of the transistor Q7 is connected to a drain of the transistor Q8.

The transistor Q8 is an n-channel MOS transistor. A gate of the transistor Q8 is connected to the power supply VDD. A source of the transistor Q8 is connected to the ground of the power supply VDD. The transistors Q7 and Q8 make up an inverter circuit D1.

The input side of the inverter circuit Z6 is connected to the drains of the transistors Q7 and Q8. The output side of the inverter circuit Z6 is connected to the input sides of the NAND circuits Z8 and Z5.

One end of the capacitor C2 is connected to the resistor R4 and the other end of the capacitor C2 is connected to the ground of the power supply VPP.

Now, the operation of the detection circuit 22 will be described.

It is assumed that power has been applied to the power supply VDD and that the semiconductor device is in norm operation. The voltage of the power supply VPP is decreased by the diode characteristics of the transistor Q6 and is input to the source of the transistor Q7. The transistor Q6 is selected or the multistage connection of the transistors Q6 is performed so that the voltage of the source of the transistor Q7 will be equal to that of the power supply VDD. As a result, when the semiconductor device is in norm operation, there is no potential difference between the source and gate of the transistor Q7 and the source-drain area of the transistor Q7 is put into the off state.

The voltage of the power supply VDD is input to the gate of the transistor Q8 and the source-drain area of the transistor Q8 is put into the on state. Therefore, the voltage of the ground of the power supply VDD generates at the drain of the transistor Q8. This means that a sign in the "L" state is output. The inverter circuit Z6 inverts the sign in the "L" state and outputs a sign in the "H" state.

It is assumed that a short break has occurred in the voltage of the power supply VDD applied. The voltage of the power supply VPP drops more slowly than that of the power supply VDD due to capacitance in the semiconductor device. Moreover, the voltage of the power supply VPP drops slowly due to the resistor R4 and capacitor C2 (CR low-pass filter).

The voltage of the source of the transistor Q7 drops slowly. On the other hand, the voltage of the gate of the transistor Q7 to which the voltage of the power supply VDD is being input drops sharply due to the short break. As a result, the potential difference between the source and gate of the transistor Q7 widens and the source-drain area of the transistor Q7 goes into the on state. Therefore, the voltage of the power supply VPP, that is to say, a sign in the "H" state generates at the drain of the transistor Q7 and is output to the inverter circuit Z6. The inverter circuit Z6 inverts the sign in the "H" state and outputs a sign in the "L" state.

Now, a description will be given with the transistors Q7 and Q8 as the inverter circuit D1. The voltage of the power supply VPP which drops more slowly than that of the power supply VDD is supplied to the inverter circuit D1 as driving power. The voltage of the power supply VDD is input to the inverter circuit D1 as an input sign. The inverter circuit D1 outputs a signal in the "H" or "L" state, depending on the voltage of the power supply VDD (voltage at norm operation time or a lower voltage at short break time).

As stated above, the detection circuit 22 detects a short break (drop) in the voltage of the power supply VDD and outputs a sign for releasing a shutoff of input of the voltage of the power supply VDD by the transistors Q1 and Q5 in the starter circuit 11 from the inverter circuit Z6.

To return to descriptions of FIG. 5, the input side of the NAND circuit Z5 is connected to the output side of the inverter circuit Z4 in the starter circuit 11 and the output side of the inverter circuit Z6 in the detection circuit 22. The NAND circuit Z5 is connected to the set pulse generation circuit 23. The NAND circuit Z5 outputs a set sign setx.

When the voltage of the power supply VDD rises after power being applied or a short break, a set sign setx goes into the "L" state. Then the set pulse generation circuit 23 holds the "L" state of the set sign setx for a predetermined period of time and outputs a set pulse sign setpx in the "H" state.

The NAND circuit Z7 is connected to the set pulse generation circuit 23. The output side of the NAND circuit Z7 is connected to the input side of the NAND circuit Z8. The output side of the NAND circuit Z7 is so connected to the capacitor C3 and the input side of the inverter circuit Z9. The capacitor C3 prevents a stop sign stop from going into the "H" state at start time due to, for example, coupling noise caused by the power supply VDD. The output side of the NAND circuit Z7 is so connected to the gate of the transistor Q1.

The input side of the NAND circuit Z8 is connected to the output side of the inverter circuit Z6. The output side of the NAND circuit Z8 is connected to the input side of the NAND circuit Z7. The NAND circuits Z7 and Z8 make up a flip-flop (FF) circuit D2. NOR circuits may make up the FF circuit D2.

The input side of the inverter circuit Z9 is connected to the output side of the NAND circuit Z7. The input side of the inverter circuit Z10 is connected to the output side of the inverter circuit Z9. The inverter circuit Z10 outputs a starter sign sttx.

Now, the operation of the starter circuit 21 in a semiconductor device shown in FIG. 5 will be described by the use of a timing chart. The starter circuit 11 and detection circuit 22 have been described above, so detailed descriptions of their operation will be omitted.

Figure 6:
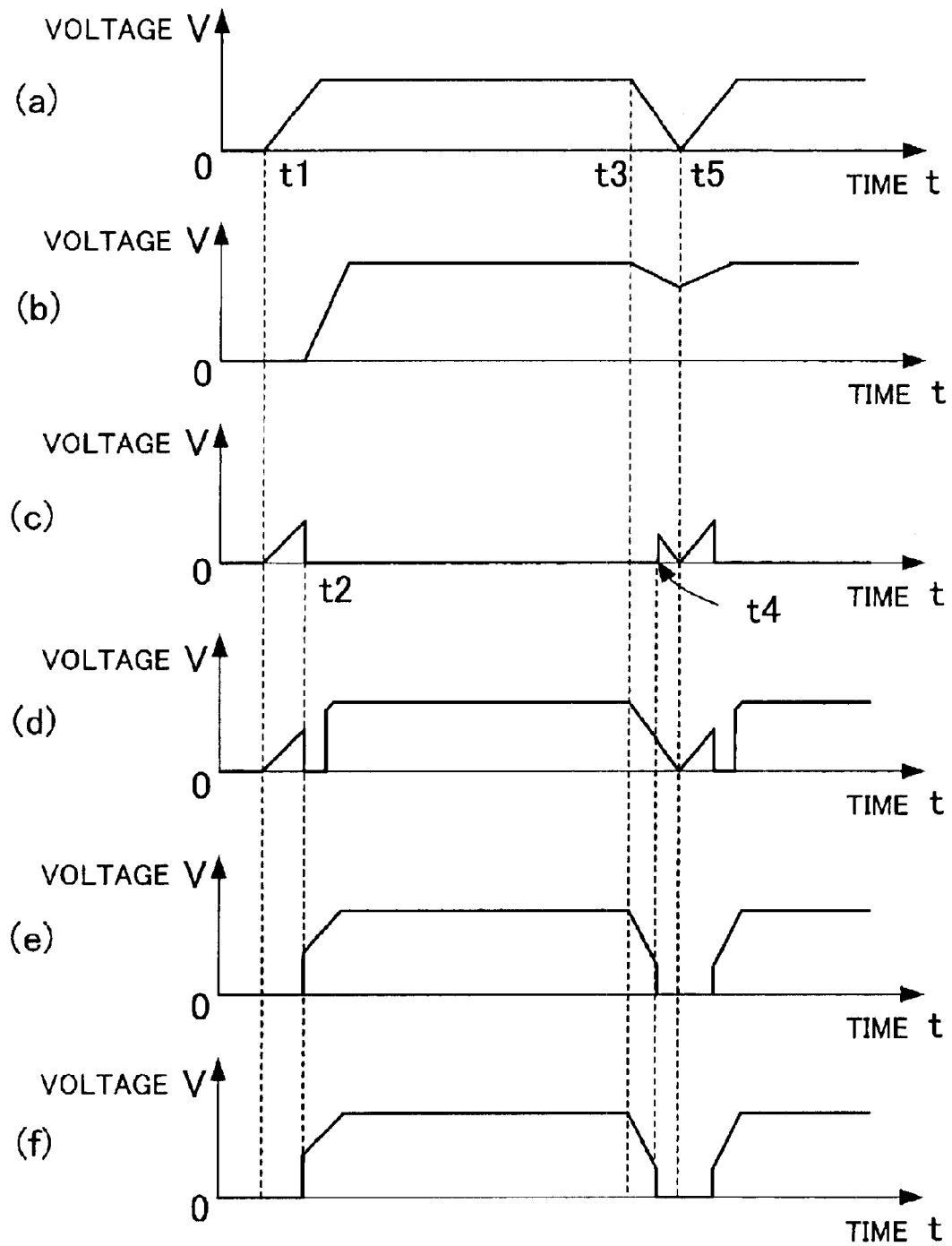
FIG. 6 is a view showing timing in the starter circuit shown in FIG. 5, (a) through (f) showing the waveform of voltage in different sections in the starter circuit.
Figure 7:
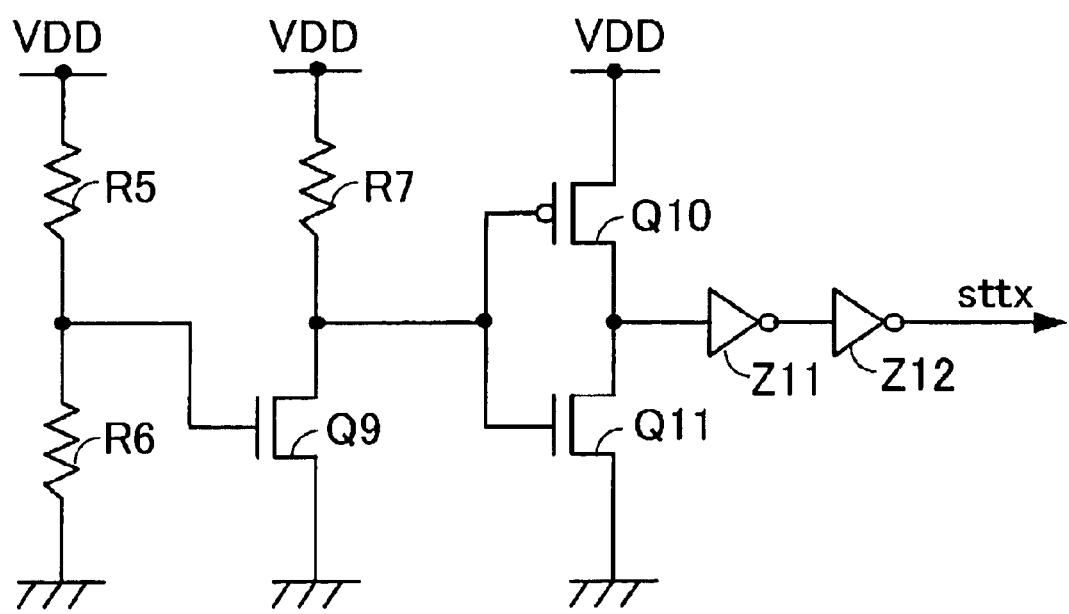
FIG. 7 is a view showing a starter circuit in a convention semiconductor device.

FIG. 6 is a view showing timing in the starter circuit shown in FIG. 5, (a) through (f) showing the waveform of voltage in different sections in the starter circuit. FIG. 6(a) shows the waveform of the voltage of the power supply VDD. FIG. 6(b) shows the waveform of the voltage of the power supply VPP. FIG. 6(c) shows the waveform of the voltage of a set sign setx output from the NAND circuit Z5. FIG. 6(d) shows the waveform of the voltage of a set pulse sign setpx output from the set pulse generation circuit 23. FIG. 6(e) shows the waveform of the voltage of a starter sign sttx output from the inverter circuit Z10. FIG. 6(f) shows the waveform of the voltage of a stop sign stop output from the FF circuit D2.

As shown in FIG. 6(a), it is assumed that power is applied to the power supply VDD at time t1. As shown in FIG. 6(a), the voltage of the power supply VDD rises.

As shown in FIG. 6(f), the stop sign stop is in the "L" state. That is to say, the drain-source areas of the transistors Q1 and Q5 are in the on state and the starter circuit 11 is in an operable state.

As shown in FIG. 6(c), the voltage of the set sign setx output from the NAND circuit Z5 rises with an increase in the voltage of the power supply VDD.

It is assumed that the voltage of the power supply VDD rises and that voltage at the point in the starter circuit 11 where the resistors R1 and R2 connect reaches the threshold voltage of the transistor Q2. Then a sign in the "H" state is output from the inverter circuit Z4. Moreover, as a result of an increase in the voltage of the power supply VDD, the inverter circuit D1 in the detection circuit 22 outputs a sign in the "L" state and the inverter circuit Z6 in the detection circuit 22 outputs a sign in the "H" state.

Accordingly, as shown in FIG. 6(c), the set sign setx output from the NAND circuit Z5 goes into the "L" state at time t2.

As shown in FIG. 6(d), the set pulse generation circuit 23 holds the "L" state of the set sign setx for a predetermined period of time from time t2 and then outputs the set pulse sign setpx in the "H" state.

The set pulse sign setpx is input to the FF circuit D2. When the set pulse sign setpx in the "H" state is input, the FF circuit D2 holds and outputs a sign in the "H" state.

The sign in the "H" state output from the FF circuit D2 is inverted by the inverter circuits Z9 and Z10 and is output as the starter sign sttx in the "H" state at time t2 as shown in FIG. 6(e). Moreover, as shown in FIG. 6(f), the stop sign stop in the "L" state changes to the "H" state at time t2. Then the stop sign stop puts the source-drain areas of the transistors Q1 and Q5 into the off state. As a result, the voltage of the power supply VDD input to the starter circuit 11 is shut off.

As stated above, the set sign setx output from the starter circuit 11 and NAND circuit Z5 is held by the FF circuit D2 and the voltage of the power supply VDD input to the starter circuit 11 is shut off. By doing so, the amount of an electric current consumed by the semiconductor device can be reduced.

As shown in FIG. 6(a), it is assumed that a short break has occurred in the voltage of the power supply VDD at time t3.

When the short break has occurred in the voltage of the power supply VDD, the voltage of the power supply VPP generated by increasing the voltage of the power supply VDD drops as shown in FIG. 6(b). The voltage of the power supply VPP drops more slowly than that of the power supply VDD due to, for example, capacitance in the semiconductor device.

As a result of a drop in the voltage of the power supply VDD caused by the short break, the inverter circuit D1 in the detection circuit 22 outputs a sign in the "H" state. Therefore, a sign in the "L" state is output from the inverter circuit Z6 in the detection circuit 22. It is assumed that the time when the detection circuit 22 detects a drop in the voltage of the power supply VDD and outputs the sign in the "L" state from the inverter circuit Z6 is t4.

The sign in the "L" state output from the inverter circuit Z6 is input to the NAND circuit Z5. Accordingly, as shown in FIG. 6(c), the NAND circuit Z5 outputs a set sign setx in the "H" state at time t4 (a sign in the "H" state is output from the inverter circuit Z4). The voltage of the power supply VDD has dropped and the NAND circuit Z5 outputs the set sign setx in the "H" state carrying voltage according to the voltage of the power supply VDD.

As shown in FIG. 6(d), the voltage of a set pulse sign setpx output from the set pulse generation circuit 23 drops according to the voltage of the power supply VDD. The set pulse sign setpx is in the "H" state at time t4.

The FF circuit D2 sets and outputs a sign in the "L" state on the basis of the sign in the "L" state output from the detection circuit 22 and the sign in the "H" state output from the set pulse generation circuit 23.

The sign in the "L" state output from the FF circuit D2 is inverted by the inverter circuits Z9 and Z10 and is output as the starter sign sttx in the "L" state at time t4 as shown in FIG. 6(e). Moreover, as shown in FIG. 6(f), the stop sign stop in the "H" state changes to the "L" state at time t4. Then the stop sign stop puts the source-drain areas of the transistors Q1 and Q5 into the on state. As a result, a shutoff of the voltage of the power supply VDD input to the starter circuit 11 is released.

When the voltage of the power supply VDD begins to rise (at time t5), the same operation that was performed when power was applied to the power supply VDD will be repeated. Descriptions of it therefore will be omitted.

As stated above, a short break in the voltage of the power supply VDD is detected by the detection circuit 22 and a shutoff of the voltage of the power supply VDD input to the starter circuit 11 is released. By doing so, an intern circuit can be initialized even when a short break has occurred in the voltage of the power supply VDD.

As has been described in the foregoing, in the present invention a starter sign output from a starter sign generation circuit on the basis of power supply voltage is held by a latch circuit and the power supply voltage input to the starter sign generation circuit is shut off. This reduces the power consumption of a semiconductor device.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as fling within the scope of the invention in the appended claims and their equivalents.

What is claimed is:

1. A semiconductor device having the function of initializing an internal circuit, the device comprising:

a starter signal generation circuit for outputting a starter signal which initializes the internal circuit on the basis of input power supply voltage;

a latch circuit for holding and outputting the starter signal;

a shutoff circuit for shutting off the power supply voltage input to the starter signal generation circuit at the time of the starter signal being output; and a detection circuit for detecting a drop in the power supply voltage and for outputting a detection signal, wherein the shutoff circuit releases the shutoff by the detection signal.

2. The semiconductor device according to claim 1, wherein the starter signal generation circuit outputs the starter signal when the power supply voltage rises to voltage at which the internal circuit performs normal operation.

3. The semiconductor device according to claim 1, wherein the detection circuit outputs the detection signal when there arises a predetermined difference between raised voltage obtained by increasing the power supply voltage and the power supply voltage.

4. The semiconductor device according to claim 3, further comprising a voltage holding circuit for holding the raised voltage.

5. The semiconductor device according to claim 3, wherein the detection circuit is an inverter circuit which inputs the power supply voltage and which uses the raised voltage as power supply.

6. The semiconductor device according to claim 5, wherein the inverter circuit includes a voltage drop circuit for decreasing the raised voltage input.

7. The semiconductor device according to claim 1, further comprising a flip-flop circuit for holding the starter signal output and the detection signal output and for outputting the starter signal and the detection signal to the shutoff circuit.

* * * * *